US012713574B2

(12) United States Patent
Hara et al.

(10) Patent No.: US 12,713,574 B2
(45) Date of Patent: Aug. 18, 2026

(54) COMPONENT FEEDING METHOD AND MANAGEMENT APPARATUS

(71) Applicant: FUJI CORPORATION, Chiryu (JP)

(72) Inventors: Kenji Hara, Kariya (JP); Mitsuru Sanji, Toyota (JP)

(73) Assignee: FUJI CORPORATION, Chiryu (JP)

(*) Notice: Subject to any disclaimer, the term of this patent is extended or adjusted under 35 U.S.C. 154(b) by 685 days.

(21) Appl. No.: 18/251,470

(22) PCT Filed: Nov. 26, 2020

(86) PCT No.: PCT/JP2020/043953
§ 371 (c)(1),
(2) Date: May 2, 2023

(87) PCT Pub. No.: WO2022/113227
PCT Pub. Date: Jun. 2, 2022

(65) Prior Publication Data

US 2023/0422460 A1 Dec. 28, 2023

(51) Int. Cl.
*H05K 13/08* (2006.01)

(52) U.S. Cl.
CPC .................................. *H05K 13/086* (2018.08)

(58) Field of Classification Search
CPC ..... H05K 13/086; H05K 13/021; H05K 13/02
See application file for complete search history.

(56) References Cited

U.S. PATENT DOCUMENTS

2017/0208713 A1* 7/2017 Iisaka .................. H05K 13/086
2018/0242485 A1 8/2018 Kondo et al.
2019/0313554 A1* 10/2019 Ao ....................... H05K 13/021

FOREIGN PATENT DOCUMENTS

WO WO 2015/004797 A1 1/2015
WO WO 2017/033268 A1 3/2017
WO WO-2018008148 A1 * 1/2018 ........... H05K 13/021
WO WO 2019/187033 A1 10/2019
WO WO 2020/161527 A1 8/2020

OTHER PUBLICATIONS

International Search Report issued Jan. 19, 2021 in PCT/JP2020/043953 filed on Nov. 26, 2020, 2 pages.

* cited by examiner

*Primary Examiner* — Thomas J Hong
*Assistant Examiner* — Jose K Abraham
(74) *Attorney, Agent, or Firm* — Oblon, McClelland, Maier & Neustadt, L.L.P.

(57) ABSTRACT

A component feeding method is for use in a component mounting system including a component mounting machine configured to pick up a component from a feeder and mount the component, a storage section configured to temporarily store a feeder accommodating a component for use in the component mounting machine, and a transfer device configured to transfer the feeder between the storage section and the component mounting machine. The method includes acquiring the number of empty portions of the storage section capable of accommodating the feeder, determining multiple feeders to be prepared for every predetermined periodic feeding time based on the number of empty portions of the storage section, and feeding the multiple feeders collectively to the storage section at every periodic feeding time.

6 Claims, 12 Drawing Sheets

| JOB NAME | REQUIRED COMPONENT | PRODUCTION NUMBER | PRODUCTION START TIME |
|---|---|---|---|
| JobA | PartA | 100 | 12:00 |
| | PartB | | |
| | PartC | | |
| | PartD | | |
| | PartE | | |
| | PartF | | |
| | PartG | | |
| | PartH | | |
| | PartI | | |
| | PartJ | | |
| | PartK | | |
| | PartL | | |
| | PartM | | |
| | PartN | | |
| JobB | PartO | 500 | 14:00 |
| | PartP | | |
| | PartQ | | |
| | PartR | | |
| JobC | PartS | 300 | 18:00 |
| | PartT | | |
| | PartU | | |
| | PartV | | |
| | PartW | | |

10
60
60
20
20
20
20
20
21B
21B
21B
21B
21B
50
PALLET TRANSFER WORK
DISMANTLING WORK
102
KITTING WORK
101
PICKING WORK
100

FEEDING PLAN CREATION PROCESSING
CALCULATE REQUIRED TIME FOR EACH COMPONENT
S100
CALCULATE FEEDING TIME FOR EACH COMPONENT
S110
CALCULATE PREPARATION TIME
S120
OUTPUT PREPARATION TIME
S130
RET

Fig. 10

| SETUP COMPONENT LIST | |
|---|---|
| FEEDING DEADLINE | COMPONENT NAME |
| 12:00 | PartA |
| 12:00 | PartB |
| 12:00 | PartC |
| 12:00 | PartD |
| 12:00 | PartE |
| 12:00 | PartF |
| 12:00 | PartG |
| 12:00 | PartH |
| 12:00 | PartI |
| 12:00 | PartJ |
| 12:00 | PartK |
| 12:00 | PartL |
| 12:00 | PartM |
| 12:00 | PartN |
| 14:00 | PartO |
| 14:00 | PartP |
| 14:00 | PartQ |
| 14:00 | PartR |
| 18:00 | PartS |
| 18:00 | PartT |
| 18:00 | PartU |
| 18:00 | PartV |
| 18:00 | PartW |

Fig. 11

| COMPONENT SHORTAGE LIST | |
|---|---|
| FEEDING DEADLINE | COMPONENT NAME |
| 12:40 | PartA |
| 13:10 | PartD |
| 13:20 | PartA |
| 13:30 | PartC |
| 14:40 | PartP |
| 14:40 | PartQ |
| 15:20 | PartP |
| 15:20 | PartQ |
| 16:00 | PartP |
| 16:00 | PartQ |
| 16:40 | PartP |
| 16:40 | PartQ |
| 17:20 | PartP |
| 17:20 | PartQ |

Fig. 13

| REQUIRED TIME LIST | |
|---|---|
| FEEDING DEADLINE | COMPONENT NAME |
| 18:00 | PartS |
| 18:00 | PartT |
| 18:00 | PartU |
| 18:00 | PartV |
| 18:00 | PartW |
| 17:20 | PartP |
| 17:20 | PartQ |
| 16:40 | PartP |
| 16:40 | PartQ |
| 16:00 | PartP |
| 16:00 | PartQ |
| 15:20 | PartP |
| 15:20 | PartQ |
| 14:40 | PartP |
| 14:40 | PartQ |
| 14:00 | PartO |
| 14:00 | PartP |
| 14:00 | PartQ |
| 14:00 | PartR |
| 13:30 | PartC |
| 13:20 | PartA |
| 13:10 | PartD |
| 12:40 | PartA |
| 12:00 | PartA |
| 12:00 | PartB |
| 12:00 | PartC |
| 12:00 | PartD |
| 12:00 | PartE |
| 12:00 | PartF |
| 12:00 | PartG |
| 12:00 | PartH |
| 12:00 | PartI |
| 12:00 | PartJ |
| 12:00 | PartK |
| 12:00 | PartL |
| 12:00 | PartM |
| 12:00 | PartN |

Fig. 14

| FEEDING LIST (FEEDING PLAN) | | COLLECTION LIST | |
|---|---|---|---|
| FEEDING DEADLINE | COMPONENT NAME | COLLECTION TIME | COMPONENT NAME |
| 17:30 | PartS | | |
| 17:30 | PartT | | |
| 17:30 | PartU | | |
| 17:30 | PartV | 17:30 | PartC |
| 17:00 | PartW | | |
| 17:00 | PartP | 17:00 | PartB |
| 16:30 | PartQ | 16:30 | PartA |
| 16:30 | PartP | | |
| 15:30 | PartQ | | |
| 15:30 | PartP | | |
| 15:30 | PartQ | | |
| 15:00 | PartP | | |
| 15:00 | PartQ | | |
| 14:30 | PartP | | |
| 14:00 | PartQ | | |
| 13:30 | PartO | | |
| 13:30 | PartP | | |
| 13:30 | PartQ | | |
| 13:30 | PartR | | |
| 13:00 | PartC | | |
| 13:00 | PartA | | |
| 12:30 | PartD | | |
| 11:30 | PartA | | |
| 11:30 | PartA | | |
| 11:30 | PartB | | |
| 11:30 | PartC | | |
| 11:30 | PartD | | |
| 11:30 | PartE | | |
| 11:00 | PartF | | |
| 11:00 | PartG | | |
| 11:00 | PartH | | |
| 11:00 | PartI | | |
| 11:00 | PartJ | | |
| 10:30 | PartK | | |
| 10:30 | PartL | | |
| 10:30 | PartM | | |
| 10:30 | PartN | | |

COMPONENT FEEDING METHOD AND MANAGEMENT APPARATUS

TECHNICAL FIELD

The present specification discloses a component feeding method and a management apparatus.

BACKGROUND ART

Conventionally, there has been proposed a component mounting system including a component mounting line that includes multiple component mounting machines arranged in a board conveyance direction and a feeder storage that stores multiple feeders detachable from each component mounting machine, and an exchanging robot that moves along the component mounting line (refer to Patent Literature 1, for example). In the component mounting system, an operator or an automated guided vehicle feeds or collects feeders to or from a storage area (slot) of the feeder storage. The exchanging robot automatically exchanges the feeders between the feeder storage and each component mounting machine. In addition, the component mounting machine is provided with a supply area where a component can be supplied and a stock area for temporarily storing the feeders separately from the feeder storage, and thus the exchanging robot can exchange the feeders between the supply area and the stock area.

PATENT LITERATURE

Patent Literature 1: International Publication WO 2017/0033268

BRIEF SUMMARY

Technical Problem

By providing a storage area in a component mounting line, it is possible to pre-feed feeders to be used for production from the next time to the storage area. As a result, even if there is a variation in the feeding of the feeders to the storage area, the storage area functions as a buffer, so that the production can be continued. However, Patent Literature 1 does not mention anything about what timing and how much the operator who prepares the feeder to be fed needs to prepare the feeder, and thus there is still room for improvement.

A main object of the present disclosure is to provide a component feeding direction and a management apparatus that can efficiently perform preparing a feeder and feeding the feeder to a storage section.

Solution to Problem

The present disclosure employs the following means in order to achieve the main object described above.

The component feeding method of the present disclosure is a component feeding method for use in a component mounting system including a component mounting machine configured to pick up a component from a feeder and mount the component, a storage section configured to temporarily store a feeder accommodating a component for use in the component mounting machine, and a transfer device configured to transfer the feeder between the storage section and the component mounting machine, the method being for feeding the feeder to the storage section, the method including acquiring the number of empty portions of the storage section capable of accommodating the feeder, determining multiple feeders to be prepared for every predetermined periodic feeding time based on the number of empty portions of the storage section, and feeding the multiple feeders collectively to the storage section at every periodic feeding time.

In the component feeding method of the present disclosure, multiple feeders to be prepared for every predetermined periodic feeding time are determined based on the number of empty portions of the storage section, and the multiple feeders are fed collectively to the storage section at every periodic feeding time. As a result, the operator can prepare the number of feeders collectively according to an empty state of the storage section, so that the preparation work of feeders can be efficiently performed as compared with a case where the preparation work of feeders occurs separately depending on a use time of the component. In addition, since the multiple feeders prepared at every periodic feeding time are collectively fed to the storage section, it is possible to efficiently feed the feeders.

BRIEF DESCRIPTION OF DRAWINGS

FIG. 1 is a schematic configuration diagram of a component mounting system.

FIG. 6 is an explanatory diagram illustrating an example of a production plan.

FIG. 10 is an explanatory diagram illustrating an example of a setup component list.

FIG. 11 is an explanatory diagram illustrating an example of a component shortage list.

FIG. 13 is an explanatory diagram illustrating an example of a required time list.

FIG. 14 is an explanatory diagram illustrating an example of a feeding list and a collection list.

DESCRIPTION OF EMBODIMENTS

Next, an embodiment of the present disclosure will be described with reference to the drawings.

Figure 1:
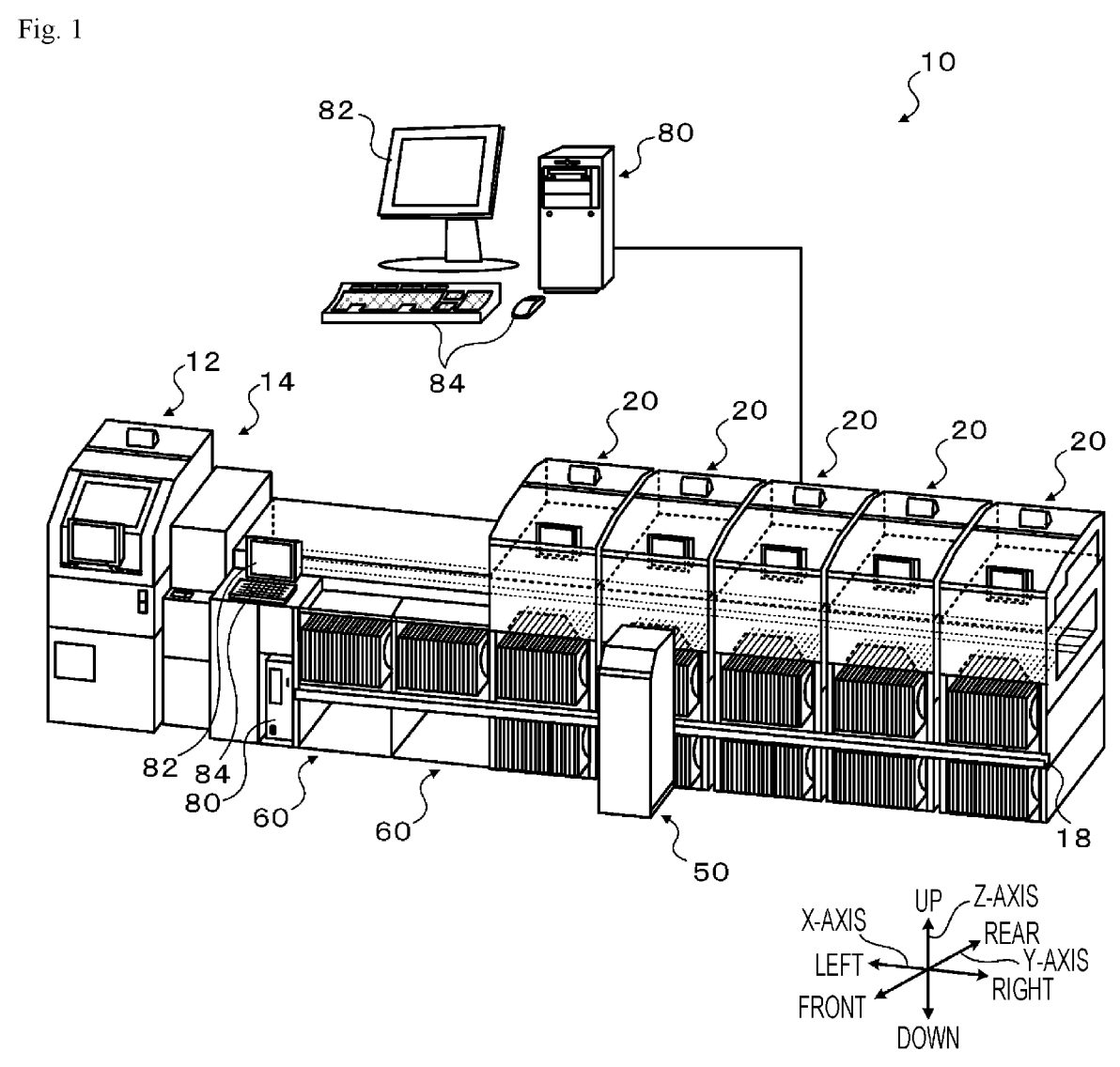
Figure 2:
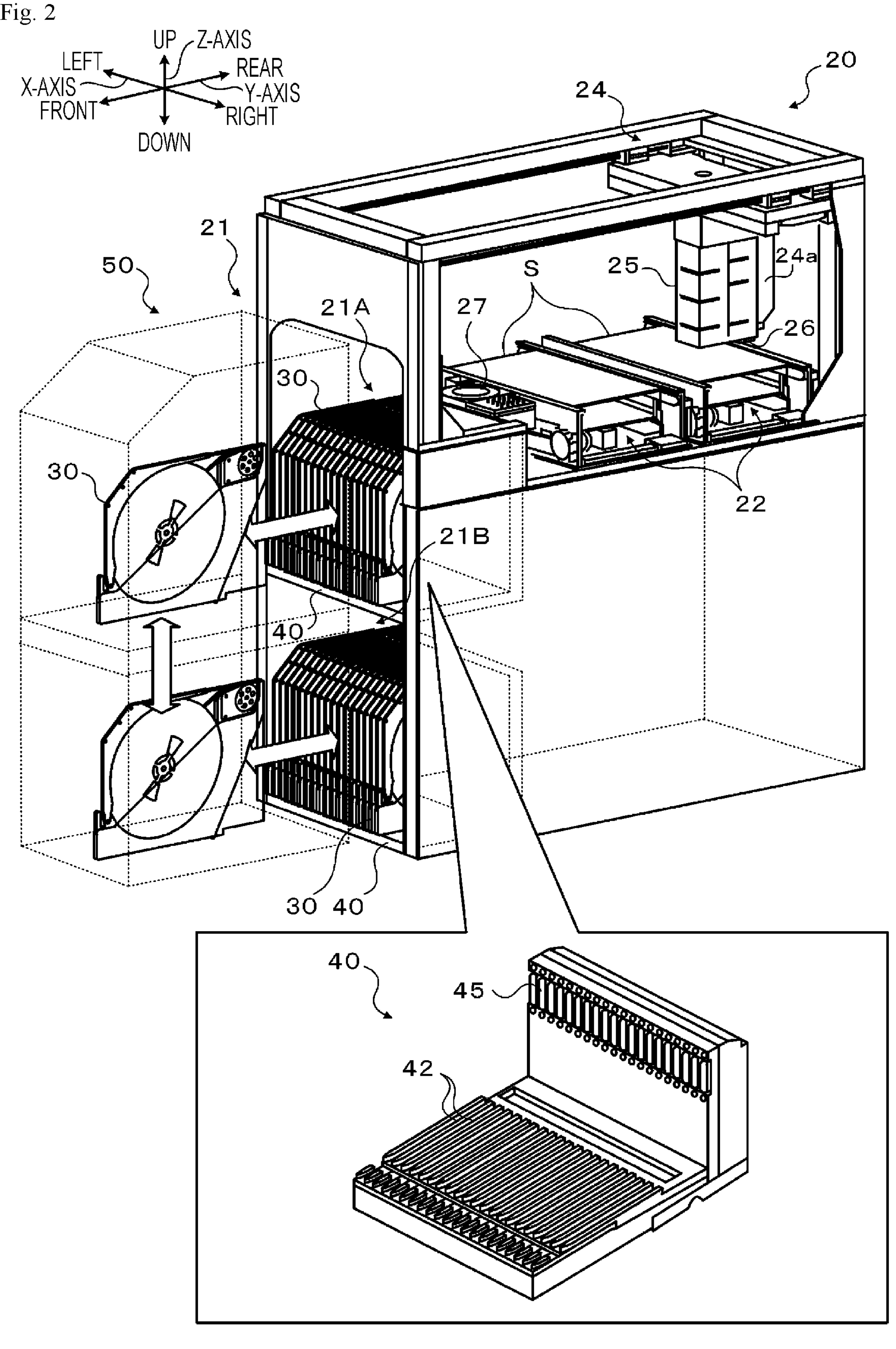
FIG. 2 is a schematic configuration diagram of a component mounting machine and a feeder.
Figure 3:
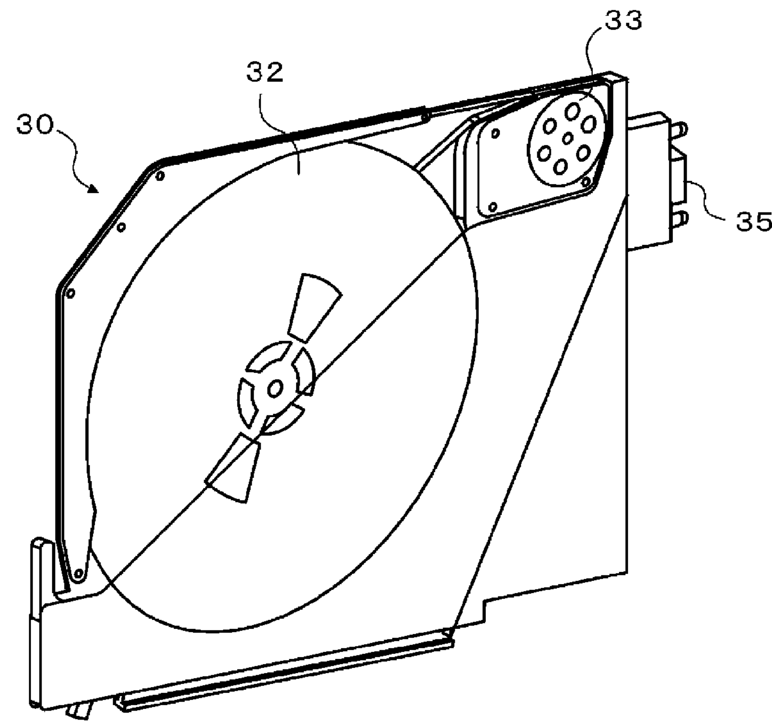
FIG. 3 is a schematic configuration diagram of a feeder.
Figure 4:
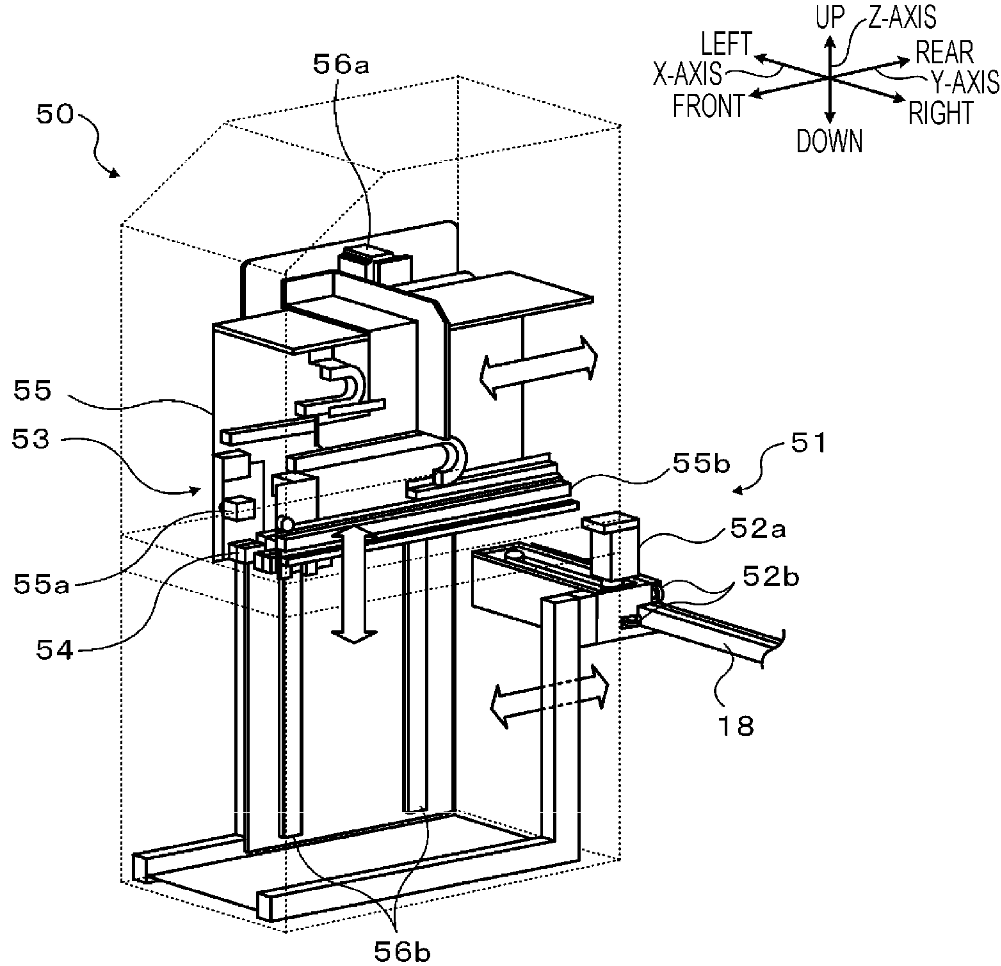
FIG. 4 is a schematic configuration diagram of a loader.
Figure 5:
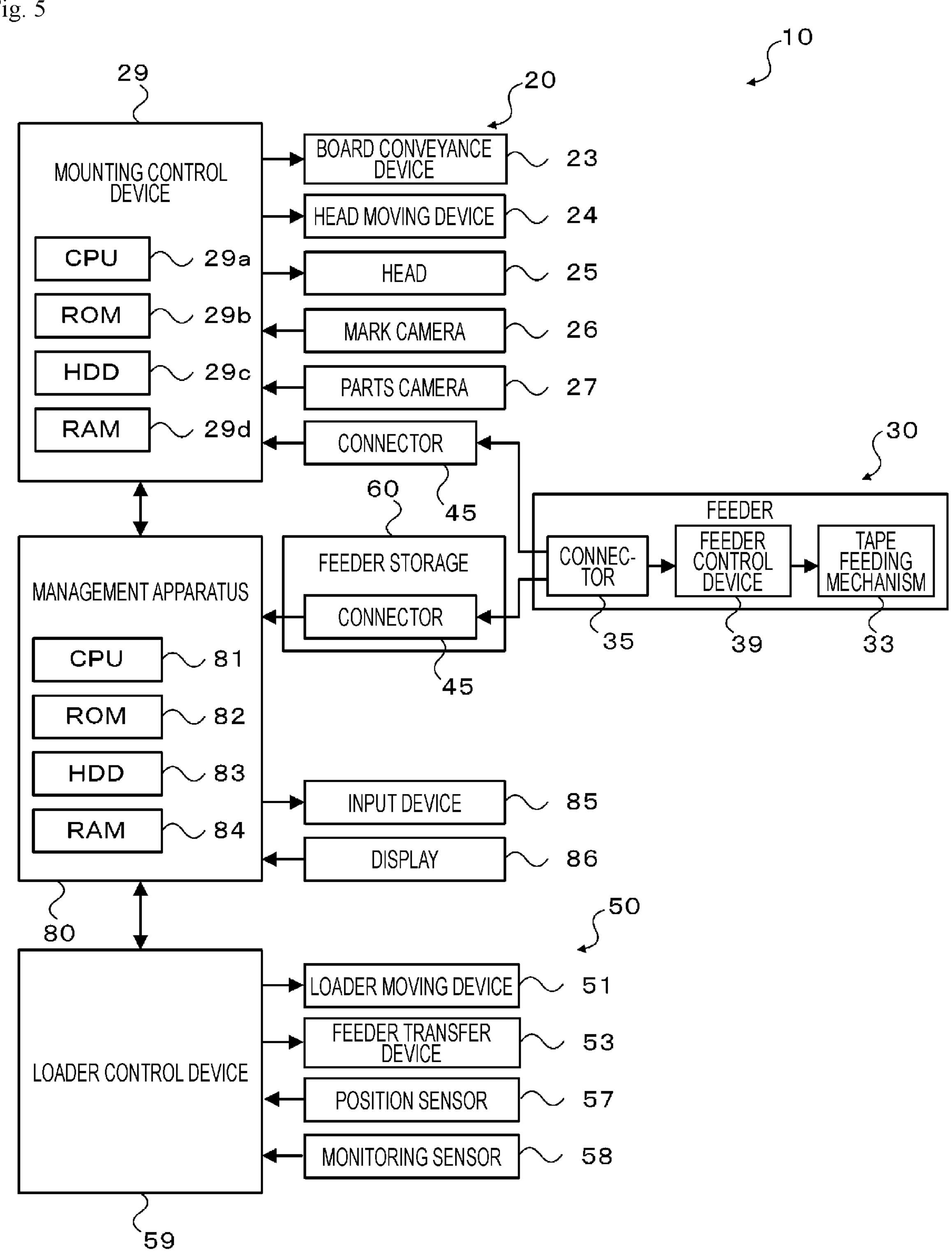
FIG. 5 is a block diagram illustrating electrical connection relationships of the component mounting system.

FIG. 1 is a schematic configuration diagram of a component mounting system. FIG. 2 is a schematic configuration diagram of a component mounting machine and a feeder base. FIG. 3 is a schematic configuration diagram of a feeder. FIG. 4 is a schematic configuration diagram of a loader. FIG. 5 is a block diagram illustrating electrical connection relationships of the component mounting system. In FIGS. 1, 2, and 4, a left-right direction is defined as an X-axis direction, a front-rear direction is defined as a Y-axis direction, and an up-down direction is defined as a Z-axis direction.

Component mounting system 10 is a system for producing board S on which a component is mounted, and includes printing device 12, print inspection device 14, multiple (five) component mounting machines 20, a mount inspection device (not illustrated), loader 50, multiple (two) feeder storages 60, and management apparatus 80 for managing the entire system, as illustrated in FIG. 1. Printing device 12 prints solder on a surface of board S. Print inspection device 14 inspects a state of the solder printed by printing device 12. Component mounting machine 20 picks up a component supplied from feeder 30 by a suction nozzle (pickup member) and mounts the component on board S. The mount inspection device inspects a mounting state of the component mounted by component mounting machine 20. Printing device 12, print inspection device 14, multiple component mounting machines 20, and the mount inspection device are arranged in this order from an upstream side along a conveyance direction of board S to constitute a production line.

As illustrated in FIG. 2, component mounting machine 20 includes attachment target section 21 to which feeder 30 is attached, board conveyance device 22 that conveys board S in the X-axis direction, head 25 that picks up a component from feeder 30 and mounts the same on board S, head moving device 24 that causes head 25 to move in a horizontal direction (XY-axis direction), and mounting control device 29 (refer to FIG. 5). Although not illustrated, head 25 includes a suction nozzle for picking up the component and a lifting and lowering device for lifting and lowering the suction nozzle. Head moving device 24 includes slider 24*a* to which head 25 is attached, and causes slider 24*a* to move in the horizontal direction (XY-axis direction).

As illustrated in FIG. 3, feeder 30 is a cassette-type tape feeder and includes tape reel 32, tape feeding mechanism 33, connector 35, and feeder control device 39 (refer to FIG. 5). Tape reel 32 is wound with a tape in which components are accommodated. Components are protected by a film covering a surface of the tape. Tape feeding mechanism 33 pulls the tape from tape reel 32 and feeds the tape to a component supply position. The component accommodated in the tape is in a state of being exposed at the component supply position by peeling off the film before the component supply position, and is picked up by head 25 (suction nozzle). Feeder control device 39 includes a well-known CPU, ROM, RAM, or the like, and outputs a drive signal to tape feeding mechanism 33 (feeding motor).

Attachment target section 21 is provided on a front surface side (front part) of component mounting machine 20, and has two upper and lower areas in which feeder 30 can be set. An upper area is supply area 21A in which feeder 30 can supply the component to a position where head 25 can pick up (component supply position) the component, and a lower area is buffer area 21B for temporarily storing feeders 30. Feeder base 40 is installed in each of areas 21A and 21B. As illustrated in FIG. 2, feeder base 40 in each of areas 21A and 21B has multiple slots 42 to and from which feeders 30 are attached and detached, and multiple connectors 45 electrically connected to connectors 35 of feeders 30 attached to corresponding slots 42. Feeders 30 accommodating components for use in a running job (production) are attached in supply area 21A. In addition, in a case where there are empty slots 42 in supply area 21A, spare feeder 30 for supplying the same type of component in place of feeder 30 which is in component shortage during the production, feeders 30 accommodating components for use in jobs executed from the next time, and the like are also attached. Buffer area 21B is used to temporarily store feeders 30 accommodating components for use in jobs executed from the next time, or to temporarily store used feeders 30.

Component mounting machine 20 also includes mark camera 26, parts camera 27, and the like. Mark camera 26 captures an image of a reference mark attached to board S from above in order to detect the position of board S. Parts camera 27 captures an image of a component picked up by the suction nozzle from below in order to detect a pickup error or a pickup deviation.

Mounting control device 29 includes well-known CPU 29*a*, ROM 29*b*, HDD 29*c*, RAM 29*d*, and the like. Mounting control device 29 inputs image signals from mark camera 26 and parts camera 27. In addition, mounting control device 29 outputs drive signals to board conveyance device 22, head 25, head moving device 24, and the like.

In addition, mounting control device 29 is communicably connected to feeder control device 39 of feeder 30 attached to feeder base 40 via connectors 35 and 45. When feeder 30 is attached, mounting control device 29 receives feeder information such as a feeder ID, a component type, and a component remaining number included in feeder control device 39 of feeder 30 from feeder control device 39. In addition, mounting control device 29 transmits the received feeder information and an attachment position (slot number) where feeder 30 is attached to management apparatus 80.

CPU 29*a* of mounting control device 29 executes mounting process for mounting a component on board S. CPU 29*a* causes head 25 to move above the component supply position of feeder 30 by head moving device 24. Subsequently, CPU 29*a* lowers the suction nozzle by the lifting and lowering device to pick up the component to the suction nozzle. CPU 29*a* causes the component picked up by the suction nozzle to move above parts camera 27 by head moving device 24, and captures an image of the component by parts camera 27. CPU 29*a* processes the captured image of the component, measures the suction deviation amount of the component, and corrects a mounting position of the component on board S. Then, CPU 29*a* causes the component picked up by the nozzle to move above the corrected mounting position by head moving device 24, and lowers the suction nozzle by the lifting and lowering device to mount the component on board S.

Each of multiple feeder storages 60 is incorporated in the production line and is a storing place for temporarily storing multiple feeders 30. In the present embodiment, feeders 30 which are scheduled to be used in each component mounting machine 20 are stored in first feeder storage 60, and used feeders 30 having used in each component mounting machine 20 are stored in second feeder storage 60. In each feeder storage 60, a feeder base including multiple slots 42 and connectors 45 similar to feeder base 40 in component mounting machine 20 is installed. When feeder 30 is attached to connector 45 of feeder storage 60, feeder information such as a feeder ID, a component type, and a component remaining number included in feeder 30, and the attachment position (slot number) where feeder 30 is attached are transmitted to management apparatus 80.

As illustrated in FIG. 1, loader 50 moves a front surface of component mounting system 10 (production line) along the line to detach feeders 30 which are in use plan from feeder storage 60 and feed feeders 30 to each component mounting machine 20, or to collect used feeders 30 from each component mounting machine 20 and convey used feeders 30 to feeder storage 60. As illustrated in FIG. 4, loader 50 includes loader moving device 51, feeder transfer device 53, and loader control device 59 (refer to FIG. 5). Loader moving device 51 causes loader 50 to move along guide rail 18 arranged in front surface of the production line. Loader moving device 51 includes X-axis motor 52*a* that drives a driving belt for moving loader 50, and guide roller 52*b* that rolls on guide rail 18 to guide the movement of loader 50. Feeder transfer device 53 transfers feeder 30 between component mounting machine 20 and loader 50 at a position where loader 50 faces any of component mounting machines 20, or transfers feeder 30 between feeder storage 60 and loader 50 at a position where loader 50 faces feeder storage 60. Feeder transfer device 53 includes Y-axis slider 55 and Z-axis motor 56*a* for moving Y-axis slider 55 along Z-axis guide rail 56*b*. Y-axis slider 55 includes clamp section 54 for clamping feeder 30, and Y-axis motor 55*a* for moving clamp section 54 along Y-axis guide rail 55*b*. Y-axis slider 55 is lifted and lowered by the driving of Z-axis motor 56*a*. In feeder transfer device 53, by raising Y-axis slider 55, Y-axis slider 55 faces feeder base 40 in supply area 21A of component mounting machine 20 and feeder base 40 in feeder storage 60, and feeder 30 is clamped by clamp section 54 and is caused to move in Y-axis direction by Y-axis slider 55 in this state, thereby transferring feeder 30 to supply area 21A and feeder storage 60. In feeder transfer device 53, by lowering Y-axis slider 55, Y-axis slider 55 faces buffer area 21B of component mounting machine 20, and feeder 30 is clamped by clamp section 54 and is caused to move in Y-axis direction by Y-axis slider 55 in this state, thereby transferring feeder 30 to buffer area 21B. Loader control device 59 includes a well-known CPU, ROM, RAM, and the like, inputs signals from position sensor 57 for detecting a traveling position or monitoring sensor 58 for detecting the presence or absence of an obstacle in the vicinity, and outputs drive signals to loader moving device 51 and feeder transfer device 53.

Management apparatus 80 is a general-purpose computer including CPU 81, ROM 82, HDD 83 (storage device), and RAM 84, as illustrated in FIG. 5. Input device 85 such as a keyboard and a mouse, and display 86 are electrically connected to management apparatus 80. HDD 83 stores a production plan, feeder holding information, job information, status information, and the like. These pieces of information are managed for each component mounting machine 20. Here, the production plan is a plan for determining which components are mounted in which order in each component mounting machine 20, and how many boards S (products) mounted as such are manufactured (produced). As illustrated in FIG. 6, the production plan includes the production number for each job, components (required components) required for the production, and a production start time. The feeder holding information is information as to feeders 30 held by each component mounting machine 20 and feeder storage 60. The feeder holding information includes feeder information such as a feeder ID, a component type, and a component remaining number, and position information such as a device (which component mounting machine 20 or feeder storage 60) that holds feeders 30 (components) and the attachment position (slot number) of feeders 30. The job information is information as to the mounting process (job) to be executed by each component mounting machine 20. The job information includes the type of board to be produced, the type of component to be mounted, a mounting position for each component, and an arrangement position (arrangement position information) of the components to be arranged in supply area 21A for each job. The status information is information indicating the operation status of each component mounting machine 20. The status information includes during the production, during a changeover, during an abnormality occurrence, and the like.

Management apparatus 80 is communicably connected to mounting control device 29 by wire, and exchanges various information with each component mounting machine 20 of component mounting system 10. Management apparatus 80 receives the operation status from each component mounting machine 20 and updates the status information to the latest information. In addition, management apparatus 80 is communicably connected to feeder control device 39 of feeder 30 attached to feeder base 40 of each component mounting machine 20 via mounting control device 29. When feeder 30 is detached from component mounting machine 20 or feeder storage 60, or is attached to component mounting machine 20 or feeder storage 60, management apparatus 80 receives the attachment and detachment status from corresponding component mounting machine 20 or corresponding feeder storage 60, and updates the feeder holding information to the latest information. In addition, management apparatus 80 is communicably connected to loader control device 59 wirelessly, and exchanges various information with loader 50. In addition to what has been described above, management apparatus 80 is also communicably connected to each control device of printing device 12, print inspection device 14, and the mount inspection device, and also exchanges various information from the corresponding devices.

In component mounting system 10 configured in this manner, the operation relating to the production of board S is automated, and work such as preparation of feeder 30 accommodating required components which are required for the production, feeding to feeder storage 60, collection of used feeder 30, and various maintenance is executed by the operator at respective suitable timings.

Figures 7, 8:
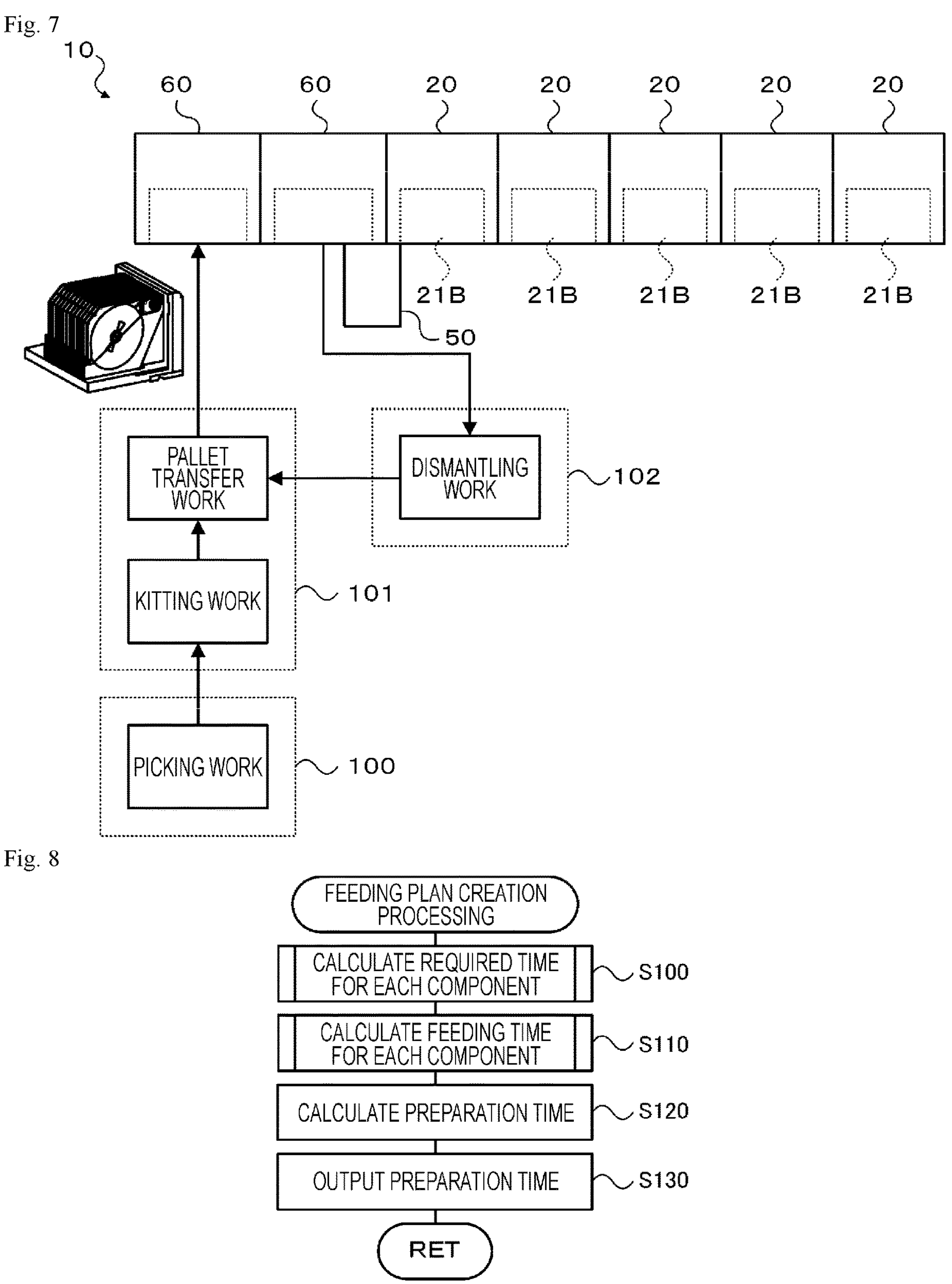
FIG. 7 is an explanatory diagram illustrating contents of work performed by an operator in relation to a preparation, feeding, and collection of feeder 30.
FIG. 8 is a flowchart illustrating an example of a feeding plan creation processing.

FIG. 7 is an explanatory diagram illustrating contents of work performed by an operator in relation to a preparation, feeding, and collection of feeder 30. As illustrated in FIG. 7, the work performed by the operator includes picking work and kitting work such as feeder feeding work, feeder collection work, dismantling work, and the like. The picking work is performed by conveying reels accommodating required components from a component shelf to external setup area 101 in component warehouse 100. The kitting work is performed by preparing feeders 30 accommodating reels (required components) conveyed to external setup area 101. The pallet transfer work is performed by attaching prepared feeders 30 to a pallet similar to feeder base 40 in external setup area 101. The feeder feeding work is performed by conveying prepared feeders 30 along with the pallet to feed feeder storage 60. Feeders 30 fed to feeder storage 60 are conveyed to corresponding component mounting machine 20 by loader 50, respectively, and are temporarily stored in buffer area 21B of corresponding component mounting machine 20. Feeders 30 temporarily stored in buffer area 21B are transferred to supply area 21A by loader 50 before the jobs which use feeders 30 are executed, and used for the production. In the present embodiment, feeders 30 are fed to feeder storage 60 by the feeder feeding work, and then transferred to buffer area 21B of each component mounting machine 20 by loader 50, but may be directly fed to buffer area 21B by the feeder feeding work.

The feeder collection work is performed by collecting used feeders 30 from feeder storage 60 to the pallet and conveying the same to collection area 102. The feeder collection work is basically executed on the return of the feeding by the feeder feeding work. The dismantling work is performed by detaching used feeders 30 from the pallet and detaching the reels (components) from used feeders 30. In addition, in a case where there are feeders 30 accommodating required components which are required for the production from the next time among used feeders 30, the operator may convey the corresponding feeders 30 as feeding target feeders 30 to external setup area 101 and attach the same to the pallet.

Not all kinds of work are limited to the work performed by the operator, and some kinds of work may be automated. For example, the pallet feeding work and the pallet collection work may be performed by an automated guided vehicle (AGV). In the present embodiment, the pallet feeding work (including the pallet collection work performed on the return of the pallet feeding work) is periodically performed at predetermined time intervals (for example, 30 minutes) (periodic feeding).

Next, an operation for creating a feeding plan for feeding (including preparing and collecting) feeder 30 will be described. FIG. 8 is a flowchart illustrating an example of the feeding plan creation processing executed by CPU 81 of management apparatus 80.

Figure 9:
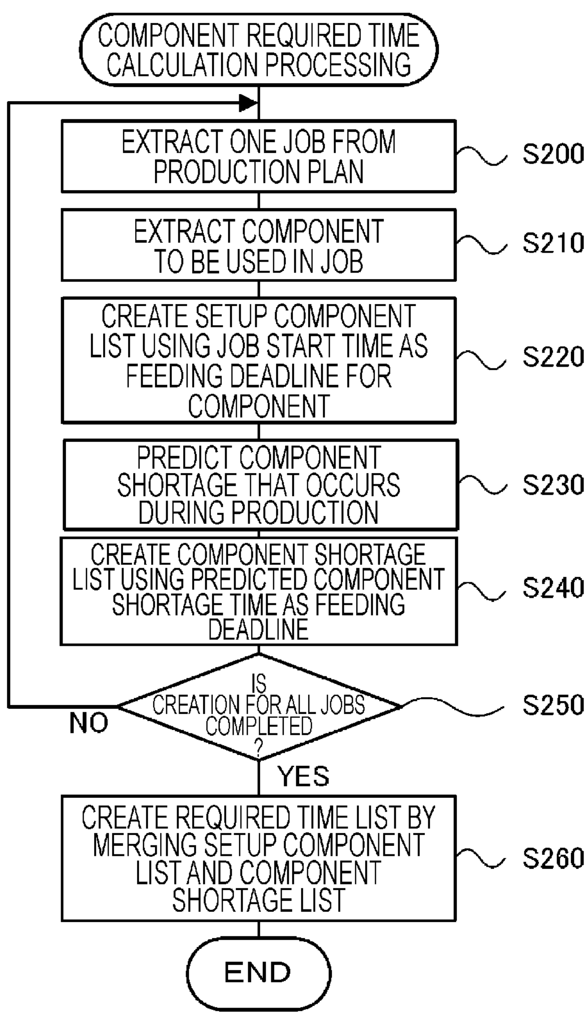
FIG. 9 is a flowchart illustrating an example of a component required time calculation processing.

When the feeding plan creation processing is executed, CPU 81 first calculates the required time for each component to be used in multiple component mounting machines 20 of component mounting system 10 (step S100). This processing is performed by executing the component required time calculation processing illustrated in FIG. 9. In the component required time calculation processing, CPU 81 first extracts one processing target job (target job) from the production plan (step S200). Subsequently, CPU 81 extracts required components which are required for the target job (step S210). In the production plan illustrated in FIG. 6, when Job A is extracted as a processing target job, CPU 81 extracts Part A to Part N as required components. When required components are extracted from the target job, CPU 81 extracts the production start time of the target job, and creates a setup component list using the extracted production start time as a feeding deadline for the required components (step S220). FIG. 10 is an explanatory diagram illustrating an example of a setup component list. As illustrated in FIG. 10, in the setup component list, component names (component types) of the required components and the feeding deadlines thereof are associated with each other. Each component in the setup component list is arranged in an order of the earlier feeding deadline.

Next, CPU 81 predicts the component shortage that occurs during the production (step S230), and creates a component shortage list using a predicted component shortage time as the feeding deadline (step S240). The prediction of the component shortage can be performed by comparing the production number of the running job with the component remaining number of the components to be used in the job, based on the production plan and the feeder holding information described above. FIG. 11 is an explanatory diagram illustrating an example of a component shortage list. As illustrated in FIG. 11, in the component shortage list, component names (component types) of components that are predicted to be in component shortage and the feeding deadlines (predicted component shortage time) thereof are associated with each other. Each component in the component shortage list is arranged in an order of the earlier feeding deadline.

When the setup component list and the component shortage list are created for the target job, CPU 81 determines whether lists are created for all jobs in the production plan (step S250). When it is determined that there is a job in the production plan in which no list is created, CPU 81 returns to step S200 to extract the next target job and repeats the processing of steps S210 to S240 to create a changeover list and the component shortage list for the next target job. On the other hand, when it is determined that there is no job in the production plan in which no list is created, CPU 81 creates a required time list in which the created setup component list and the component shortage list are merged (step S260), and ends the component required time calculation processing.

Figure 12:
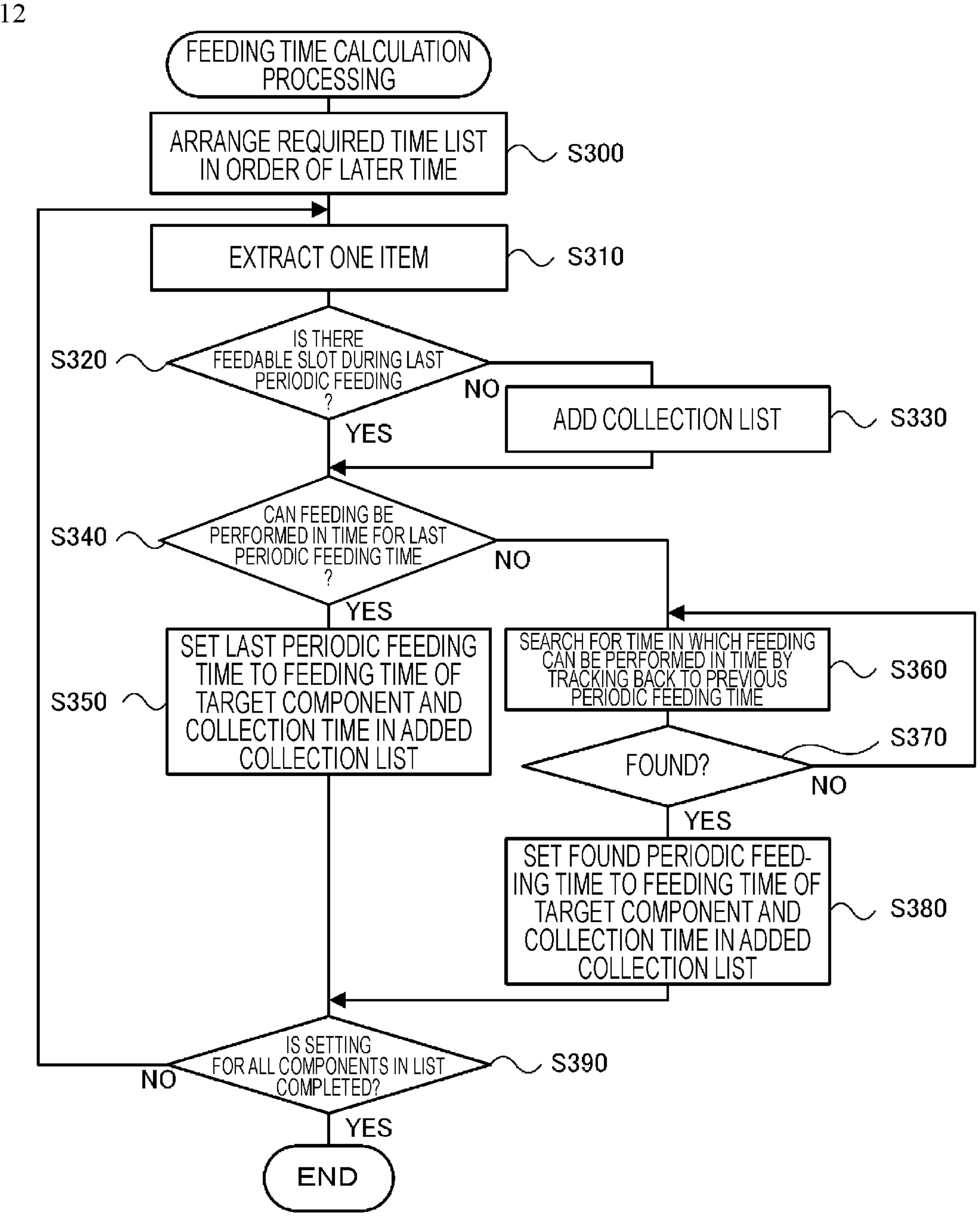
FIG. 12 is a flowchart illustrating an example of a feeding time calculation processing.

Returning to the feeding plan creation processing, CPU 81 then calculates the feeding time of each component (step S110). This processing is performed by executing the feeding time calculation processing in FIG. 12. In the feeding time calculation processing, CPU 81 first rearranges the required time list created in step S100 in order of a later feeding deadline (step S300). Subsequently, CPU 81 extracts one processing target component (target component) in order from the head in the required time list (in order of the later feeding deadline) (step S310). Then, CPU 81 determines whether there is a feedable slot capable of feeding feeder 30 accommodating the target component at a periodic feeding time which is immediately before the feeding deadline for the target component in the periodic feeding time at predetermined intervals (step S320). When it is assumed that components whose feeding deadlines arrive before the feeding deadline for the target component among the components in the required time list are fed components, this processing is performed by determining whether a value obtained by subtracting the number of feeders 30 accommodating the fed components from the maximum accommodation number of feeders 30 in each feeder storage 60 and each buffer area 21B is larger than a threshold value. For example, in a case where each of the two feeder storages 60 has slot 42 in which a maximum of 44 feeders 30 can be attached, and each of buffer areas 21B of five component mounting machines 20 has slot 42 in which a maximum of 32 feeders 30 can be attached, the maximum accommodation number is 248 (44×2+32×5). The threshold value may be, for example, the number of accommodations in one feeder storage 60. As a result, feeder base 40 (pallet) is attached to and detached from feeder storage 60, so that feeders 30 can be fed or collected in a unit of pallet. The threshold value may be set to a value of 0, so that feeders 30 may be fed one by one to feeder storage 60. In the present embodiment, since the feeding of feeders 30 (components) is performed on feeder storage 60, it is necessary to secure empty slots in feeder storage 60 in order to feed feeders 30 to feeder storage 60. However, even if feeder storage 60 is full, when there are empty slots in buffer area 21B of each component mounting machine 20, feeders 30 in feeder storage 60 can be transferred to the empty slots in buffer area 21B by loader 50, so that empty slots can be secured in feeder storage 60.

When it is determined that there is a feedable slot at the last periodic feeding time, CPU 81 proceeds to step S340. On the other hand, when it is determined that there is no feedable slot at the last periodic feeding time, CPU 81 adds a collection list to secure a feedable slot (step S330). This processing is performed by extracting used feeders 30 (components) from feeders 30 (components) in feeder storage 60 and each buffer area 21B based on the job information and the feeder holding information and adding the same to the collection list. In a case where used feeders 30 added to the collection list are in buffer area 21B, loader 50 transfers used feeders 30 to feeder storage 60.

Next, CPU 81 determines whether the target component can be fed in time for the last periodic feeding time (step S340). This processing is performed by determining whether the number of components which have the same feeding time as the periodic feeding time and which are determination targets and in step S340 among the set components having the feeding time set in step S350 or S380 described later is reached the maximum accommodation number (for example, 32 feeders) in the pallet used in the feeder feeding work. If the number of corresponding components has not reached the maximum accommodation number in the pallet, CPU 81 determines that the feeding can be performed in time for the last periodic feeding time. On the other hand, if the number of corresponding components has reached the maximum accommodation number in the pallet, new feeder 30 cannot be attached to the pallet anymore, and thus CPU 81 determines that the feeding cannot be performed in time for the last periodic feeding time.

When it is determined that the feeding can be performed in time for the last periodic feeding time, CPU 81 sets the last periodic feeding time to the feeding time of the target component, and when there is an addition to the collection list in step S330, sets the periodic feeding time to the collection time in the added collection list (step S350). On the other hand, when it is determined that the feeding cannot be performed in time for the last periodic feeding time, CPU 81 searches for a periodic feeding time in which the feeding can be performed in time by tracing back to the previous periodic feeding time one by one until a periodic feeding time in which the feeding can be performed in time is found (steps S360 and 370). Then, when the periodic feeding time in which the feeding can be performed in time is found, CPU 81 sets the periodic feeding time to the feeding time of the target component, and when there is an addition to the collection list in step S330, sets the periodic feeding time to the collection time in the added collection list (step S380).

When the feeding time of the target component is set in this manner, CPU 81 determines whether there is a component whose feeding time is not set in the required time list (step S390). When it is determined that there is a component whose feeding time is not set in the required time list, CPU 81 returns to step S310 and repeats the processing of steps S310 to S380 for extracting the next target component and setting the feeding time. On the other hand, when it is determined that there is no component for which the feeding time is not set in the required time list, CPU 81 ends the feeding time calculation processing.

Returning to the feeding plan creation processing, CPU 81 then calculates a preparation time (preparation start time or preparation end time) from the feeding time set for each component so that the feeding time can be in time (step S120), outputs the calculated preparation time as a list to display 86 or to a portable information terminal (not illustrated) carried by the operator (step S130), and ends the feeding plan creation processing. The operator advances the preparation of feeders 30 accommodating required components according to the instructed preparation time, and when the periodic feeding time arrives, collectively feeds prepared feeders 30 in a unit of pallet to feeder storage 60. When there is used feeder 30 to be collected in the collection list, the operator collects feeder 30 to be collected on the return. As a result, it is possible to efficiently feed and collect feeders 30. In addition, by periodically feeding feeders 30 to be used for the production from the next time, even if a variation occurs in the feeding of feeders 30, feeder storage 60 and buffer area 21B can be caused to function as buffers, so that the execution (production) of the job can be continued.

Here, a non-binding correspondence between elements of the present embodiment and elements disclosed in the columns of the claims will be described. That is, component mounting system 10 of the present embodiment corresponds to the component mounting system of the present disclosure, component mounting machine 20 corresponds to the component mounting machine, feeder storage 60 or buffer area 21B of component mounting machine 20 corresponds to storage section, and loader 50 corresponds to the transfer device.

As a matter of course, the present disclosure is not limited to the above-described embodiment in any way, and can be embodied in various aspects without departing from the technical scope of the present disclosure.

For example, in the embodiment described above, CPU 81 extracts the component in order from the later feeding deadline in the required time list and sets the feeding time, but may extract the component in order from the earlier feeding deadline and set the feeding time.

In the above embodiment, component mounting system 10 includes feeder storage 60 and buffer area 21B of component mounting machine 20 as storing places for temporarily storing feeders 30. However, component mounting system 10 may include only one of feeder storage 60 and buffer area 21B. In a case where only buffer area 21B is provided as a storing place of feeders 30, the operator or the automated guided vehicle may directly feed feeders 30 to buffer area 21B.

As described above, the component feeding method of the present disclosure is a component feeding method for use in a component mounting system including a component mounting machine configured to pick up a component from a feeder and mount the component, a storage section configured to temporarily store a feeder accommodating a component for use in the component mounting machine, and a transfer device configured to transfer the feeder between the storage section and the component mounting machine, the method being for feeding the feeder to the storage section, the method including acquiring the number of empty portions of the storage section capable of accommodating the feeder, determining multiple feeders to be prepared for every predetermined periodic feeding time based on the number of empty portions of the storage section, and feeding the multiple feeders collectively to the storage section at every periodic feeding time.

In the component feeding method of the present disclosure, the operator can prepare the number of feeders collectively according to an empty state of the storage section, so that the preparation work of the feeders can be efficiently performed as compared with a case where the preparation work of the feeders occurs separately depending on the use time of the component. In addition, since the multiple feeders prepared at every periodic feeding time are collectively fed to the storage section, it is possible to efficiently feed the feeders.

In such a component storage method of the present disclosure, the component feeding method may further include acquiring a use time for each component used in the component mounting machine, and determining the multiple feeders to be prepared so that a feeder accommodating a feeding target component is fed at a feeding time before the use time of the feeding target component in the periodic feeding time, based on the number of empty portions of the storage section and the use time for each component. In this way, the feeding of the feeders can be more surely performed in time due to the use time of the component, and it is possible to prevent the suspension of the production.

In this case, the component feeding method may further include determining the multiple feeders to be prepared so that the feeder accommodating the feeding target component is preferentially fed at a feeding time close to the use time of the feeding target component in the periodic feeding time. In this way, it is possible to suppress a case in which a component having a late use time is fed first, and thus the number of empty portions of the storage section decreases, so that a component having an earlier use time cannot be stored in the storage section.

In addition, in the component feeding method of the present disclosure, the component feeding method may further include determining the multiple feeders to be prepared after setting used feeders among the feeders stored in the storage section as collecting targets in a case where the number of empty portions of the storage section is insufficient, and feeding the multiple feeders while collecting the feeders set as the collecting targets at the periodic feeding time. In this way, it is possible to store a large number of unused components (feeders) by increasing the number of empty portions of the storage section.

Further, in the component feeding method of the present disclosure, the component feeding method may further include feeding the multiple feeders attached in multiple slots in a pallet along with the pallet, and determining the multiple feeders to be prepared within a range of the number of slots in the pallet. In this way, it is possible to more efficiently feed the components (feeders).

The present disclosure is not limited to the form of the component feeding method, and may be the form of a management apparatus for managing the feeding of the feeders to the storage section.

INDUSTRIAL APPLICABILITY

The present disclosure can be applied to a manufacturing industry such as a component mounting system or a management apparatus.

REFERENCE SIGNS LIST

10 component mounting system, 12 printing device, 14 print inspection device, 18 guide rail, 20 component mounting machine, 21 attachment target section, 21A supply area, 21B buffer area, 22 board conveyance device, 24 head moving device, **24*a* slider, 25 head, 26 mark camera, 27 parts camera, 29 mounting control device, 29*a* CPU, 29*b* ROM, 29*c* HDD, 29*d* RAM, 30 feeder, 32 tape reel, 33 tape feeding mechanism, 35 connector, 39 feeder control device, 40 feeder base, 42 slot, 45 connector, 50 loader, 51 loader moving device, 52*a* X-axis motor, 52*b* guide roller, 53 feeder transfer device, 54 clamp section, 55 Y-axis slider, 55*a* Y-axis motor, 55*b* Y-axis guide rail, 56*a* Z-axis motor, 56*b* Z-axis guide rail, 57 position sensor, 58 monitoring sensor, 59 loader control device, 60 feeder storage, 80 management apparatus, 81 CPU, 82 ROM, 83 HDD, 84 RAM, 85 input device, 86 display, 100 component warehouse, 101 external setup area, 102** collection area

The invention claimed is:

1. A component feeding method for use in a component mounting system including a component mounting machine configured to pick up a component from a feeder and mount the component, a storage section configured to temporarily store a feeder accommodating a component for use in the component mounting machine, and a transfer device configured to transfer the feeder between the storage section and the component mounting machine, the method being for feeding the feeder to the storage section, the method comprising:

acquiring a number of empty portions of the storage section capable of accommodating the feeder;

determining multiple feeders to be prepared for every predetermined periodic feeding time based on the number of empty portions of the storage section after setting used feeders among the feeders stored in the storage section as collecting targets in a case where the number of empty portions of the storage section is insufficient; and feeding the multiple feeders collectively to the storage section at every periodic feeding time.

2. The component feeding method according to claim 1, further comprising:

acquiring a use time based on a production start time at which each component is used in the component mounting machine; and determining the multiple feeders to be prepared so that a feeder accommodating a feeding target component is fed at a feeding time before the use time of the feeding target component in the periodic feeding time, based on the number of empty portions of the storage section and the use time for each component.

3. The component feeding method according to claim 2, further comprising:

determining the multiple feeders to be prepared so that the feeder accommodating the feeding target component is preferentially fed at a feeding time close to the use time of the feeding target component in the periodic feeding time.

4. The component feeding method according to claim 1, further comprising feeding the multiple feeders while collecting feeders set as the collecting targets at the periodic feeding time.

5. The component feeding method according to claim 1, further comprising:

feeding the multiple feeders attached in multiple slots in a pallet along with the pallet; and determining the multiple feeders to be prepared within a range of the number of slots in the pallet.

6. A management apparatus for use in a component mounting system including a component mounting machine configured to pick up a component from a feeder and mount the component, a storage section configured to temporarily store a feeder accommodating a component for use in the component mounting machine, and a transfer device configured to transfer the feeder between the storage section and the component mounting machine, wherein the management apparatus acquires a number of empty portions of the storage section capable of accommodating the feeder, determines multiple feeders to be prepared for every predetermined periodic feeding time based on the number of empty portions of the storage section determining after setting used feeders among the feeders stored in the storage section as collecting targets in a case where the number of empty portions of the storage section is insufficient, and issues a feeding instruction to feed the multiple feeders collectively to the storage section at every periodic feeding time.

* * * * *